(12) United States Patent
Aritome et al.

(10) Patent No.: US 7,738,291 B2
(45) Date of Patent: Jun. 15, 2010

(54) MEMORY PAGE BOOSTING METHOD, DEVICE AND SYSTEM

(75) Inventors: Seiichi Aritome, Boise, ID (US); Jeffrey C. Antosh, Nampa, ID (US); Roderick C. Frianeza, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 150 days.

(21) Appl. No.: 11/717,550

(22) Filed: Mar. 12, 2007

(65) Prior Publication Data

US 2008/0225589 A1   Sep. 18, 2008

(51) Int. Cl.
G11C 16/04 (2006.01)

(52) U.S. Cl. .................. 365/185.03; 365/185.12; 365/185.18; 365/185.23

(58) Field of Classification Search ............ 365/185.03, 365/185.18, 185.17, 185.19, 185.23, 185.33
See application file for complete search history.

(56) References Cited

U.S. PATENT DOCUMENTS

| | | | |
|---|---|---|---|
| 5,675,540 A | 10/1997 | Roohparvar | |
| 5,974,499 A | 10/1999 | Norman et al. | |
| 6,058,042 A | 5/2000 | Nobukata | |
| 6,072,721 A | 6/2000 | Arase | |
| RE37,611 E | 3/2002 | Roohparvar | |
| 6,493,265 B2 | 12/2002 | Satoh et al. | |
| 6,519,184 B2 | 2/2003 | Tanaka et al. | |
| 6,545,909 B2 | 4/2003 | Tanaka et al. | |
| 6,614,688 B2 | 9/2003 | Jeong et al. | |
| 6,859,394 B2 | 2/2005 | Matsunaga et al. | |
| 6,859,395 B2 | 2/2005 | Matsunaga et al. | |
| 6,977,842 B2 | 12/2005 | Nazarian | |
| 6,996,003 B2 | 2/2006 | Li et al. | |
| 7,020,017 B2 * | 3/2006 | Chen et al. ............. | 365/185.03 |
| 7,061,306 B2 | 6/2006 | Nazarian et al. | |
| 7,170,788 B1 * | 1/2007 | Wan et al. ............. | 365/185.18 |
| 7,301,817 B2 * | 11/2007 | Li et al. ................. | 365/185.22 |
| 7,355,888 B2 * | 4/2008 | Hemink et al. ......... | 365/185.17 |
| 7,440,323 B2 * | 10/2008 | Lutze et al. ............ | 365/185.17 |
| 2002/0110019 A1 | 8/2002 | Satoh et al. | |
| 2003/0053327 A1 | 3/2003 | Kang et al. | |
| 2005/0105334 A1 | 5/2005 | Futatsuyama | |
| 2005/0226055 A1 | 10/2005 | Guterman | |
| 2005/0273548 A1 | 12/2005 | Roohparvar | |
| 2005/0273549 A1 | 12/2005 | Roohparvar | |
| 2005/0276108 A1 | 12/2005 | Guterman | |
| 2005/0286297 A1 | 12/2005 | Roohparvar | |
| 2006/0039198 A1 | 2/2006 | Guterman et al. | |

(Continued)

FOREIGN PATENT DOCUMENTS

EP    0 923 139 A2    6/1999

(Continued)

*Primary Examiner*—David Lam
(74) *Attorney, Agent, or Firm*—TraskBritt

(57) ABSTRACT

A memory page boosting method, device and system for boosting unselected memory cells in a multi-level cell memory cell is described. The memory device includes a memory array of multi-level cell memory cells configured to store a first portion of logic states and a second portion of logic states. When programming the first portion of logic states, a first boosting process is applied to unselected memory cells and when programming the second portion of logic states, a second boosting process is applied to unselected memory cells.

18 Claims, 9 Drawing Sheets

U.S. PATENT DOCUMENTS

| | | |
|---|---|---|
| 2006/0050561 A1 | 3/2006 | Guterman et al. |
| 2006/0092683 A1 | 5/2006 | Li et al. |
| 2006/0120152 A1 | 6/2006 | Lee et al. |
| 2006/0193169 A1 | 8/2006 | Nazarian |
| 2006/0193176 A1 | 8/2006 | Li |
| 2006/0198192 A1 | 9/2006 | Guterman et al. |
| 2006/0198193 A1 | 9/2006 | Roohparvar |
| 2006/0198195 A1 | 9/2006 | Hemink et al. |
| 2006/0198217 A1 | 9/2006 | Roohparvar |
| 2006/0209596 A1 | 9/2006 | Li |
| 2006/0227613 A1 | 10/2006 | Joo |
| 2006/0239069 A1 | 10/2006 | Kamigaichi et al. |
| 2006/0245257 A1 | 11/2006 | Nazarian |
| 2006/0245290 A1 | 11/2006 | Han et al. |
| 2006/0262602 A1 | 11/2006 | Nazarian |
| 2007/0011581 A1 | 1/2007 | Nakanishi et al. |
| 2007/0291542 A1 * | 12/2007 | Aritome ................ 365/185.18 |

FOREIGN PATENT DOCUMENTS

WO    WO 2005/104135 A1    11/2005

* cited by examiner

MEMORY PAGE BOOSTING METHOD, DEVICE AND SYSTEM

FIELD OF THE INVENTION

Various embodiments of the present invention relate generally to the field of nonvolatile memory devices and, more particularly, to programming data into nonvolatile memory devices.

BACKGROUND OF THE INVENTION

Memory devices are conventionally provided as internal, semiconductor, integrated circuits in computers or other electronic devices. There are many different types of memory including random-access memory (RAM), read only memory (ROM), dynamic random access memory (DRAM), synchronous dynamic random access memory (SDRAM), and flash memory.

Flash memory devices have developed into a popular source of non-volatile memory for a wide range of electronic applications. Flash memory devices conventionally use a one-transistor memory cell that allows for high memory densities, high reliability, and low power consumption. Common uses for flash memory include portable audio/video storage devices, personal computers, personal digital assistants (PDAs), digital cameras, and cellular telephones.

As the performance and complexity of electronic systems increase, the requirement for additional memory in a system also increases. However, in order to continue to reduce the costs of the system, the parts count must be kept to a minimum. This can be accomplished by increasing the memory density of an integrated circuit.

One way to increase memory density is to use multi-level cell (MLC) non-volatile memory. This method stores two or more data bits in each memory cell. One problem with conventional MLC non-volatile memory is that subsequent programming of additional data can cause a program disturb condition that can program bits that are not desired to be programmed or create errors in already programmed bits. This is caused by placing a large programming voltage on a wordline that is shared by other cells that have either not been programmed or have already been programmed.

For the reasons stated above, and for other reasons stated below which will become apparent to those skilled in the art upon reading and understanding the present specification, there is a need in the art for reducing errors when programming MLC non-volatile memory cells.

DETAILED DESCRIPTION OF THE INVENTION

In the following detailed description, reference is made to the accompanying drawings that form a part hereof, and in which is shown by way of illustration specific embodiments in which the invention may be practiced. These embodiments are described in sufficient detail to enable those skilled in the art to practice the invention, and it is to be understood that other embodiments may be utilized, and that structural, logical and electrical changes may be made without departing from the spirit and scope of the present invention.

A memory page boosting method, device and system is described. In one embodiment of the present invention, a method for programming a multi-level cell memory array includes boosting channels of unselected memory cells using a first boosting process when programming a first portion of logic states in a multi-level cell memory cell and boosting channels of unselected memory cells using a second boosting process when programming a second portion of logic states in a multi-level cell memory cell.

In another embodiment of the present invention a memory device is disclosed. The memory device includes a memory array of multi-level cell memory cells configured to store a first portion of logic states and a second portion of logic states. When programming the first portion of logic states, a first boosting process is applied to unselected memory cells and when programming the second portion of logic states, a second boosting process is applied to unselected memory cells.

A further embodiment of a memory device includes a memory array of multi-level cell flash memory cells arranged with a plurality of wordlines and bit lines. A programming circuitry is configured to boost a channel of unselected flash memory cells sharing a programming wordline using a first boosting process when a first portion of logic states is being programmed on the common wordline. The programming circuitry is further configured to boost the channel of unselected flash memory cells using a second boosting process when a second portion of logic states is being programmed on the common wordline.

An electronic system, in accordance with a further embodiment, is also disclosed and includes a processor for generating memory signals and a memory device. The memory device includes an array of multi-level cell memory cells and programming circuitry. The programming circuitry is configured to boost unselected memory cells according to a first boosting process when first logic states are being programmed into the memory cells and boost unselected memory cells according to a second boosting process when second logic states are being programmed into the memory cells.

Figure 1:
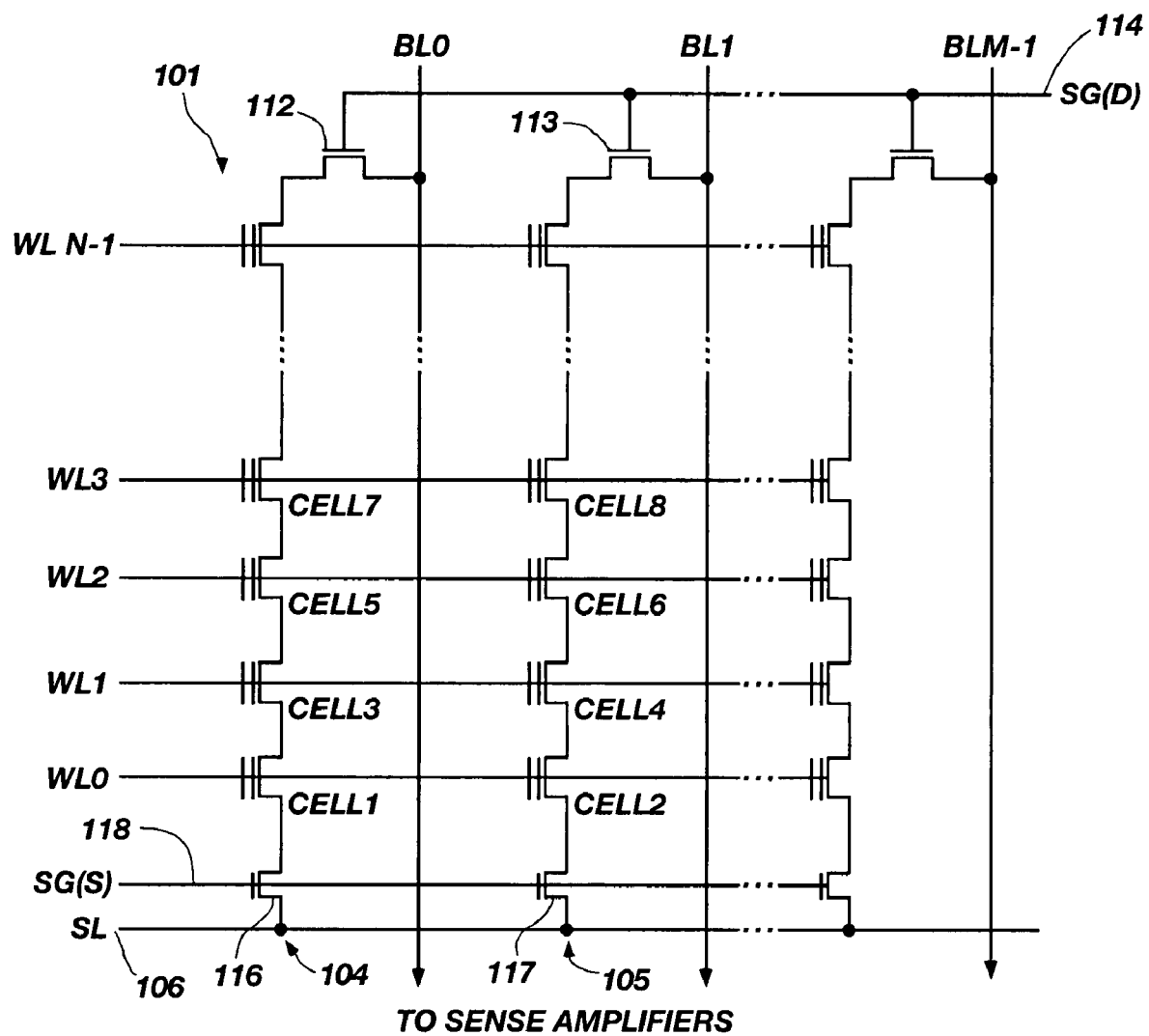
FIG. 1 illustrates a simplified diagram of one embodiment for a semiconductor NAND flash memory array of the present invention.

FIG. 1 illustrates a simplified diagram of one embodiment of the present invention configured as a semiconductor NAND flash memory array. This memory array is for purposes of illustration only as the present invention is not limited to NAND flash but can be used for other flash architectures (e.g., NOR, AND) and other non-volatile memory technologies such as electrically erasable programmable read only memory (EEPROM).

The memory array of FIG. 1, for purposes of clarity, does not show all of the elements typically employed in a memory array. For example, only three bit lines are shown (BL0, BL1, and BLM-1) when the number of bit lines required actually depends upon the memory density and chip architecture. The bit lines are subsequently referred to as (BL0-BLM-1). The bit lines (BL0-BLM-1) are eventually coupled to sense amplifiers (not shown) that detect the state of each cell.

The array comprises an array 101 of floating gate cells arranged in series strings 104, 105. Each of the floating gate memory cells of array 101 is coupled drain to source in each series string 104, 105. A wordline (WL0-WLN-1) that spans across multiple series strings 104, 105 is coupled to the control gates of every floating gate memory cell in a row in order to control their operation. In one embodiment, an array comprises 32 wordlines. However, the present invention is not limited to any one wordline quantity.

In operation, the wordlines (WL0-WLN-1) select the individual floating gate memory cells in each series string 104, 105 to be written to or read from and operate the remaining floating gate memory cells in each series string 104, 105 in a pass through mode. Each series string 104, 105 of floating gate memory cells is coupled to a source line 106 by a source select gate 116, 117 and to an individual bit line (BL-BLM-1) by a drain select gate 112, 113. The source select gates 116, 117 are controlled by a source select gate control line SG(S) 118 coupled to their control gates. The drain select gates 112, 113 are controlled by a drain select gate control line SG(D) 114.

In the embodiment of FIG. 1, the bottom of the array (i.e., WL0) is at the bottom of the page and the top of the array (i.e., WLN-1) is at the top of the page. However, these labels are for purposes of illustration only as WL0 can also begin at the top of the page with the wordline numbers increasing towards the bottom of the page.

Each memory cell can be programmed as a single bit per cell (i.e., single level cell—(SLC)) or multiple bits per cell (i.e., multiple level cell—(MLC)). Each memory cell's threshold voltage ($V_t$) determines the data that is stored in the cell. For example, in a single bit per cell arrangement, a $V_t$ of about 0.8 V might indicate a programmed cell while a $V_t$ of about −0.5 V might indicate an erased cell. The multi-level cell may have multiple $V_t$ windows that each indicate a different state. Multi-level cells take advantage of the analog nature of a traditional flash cell by assigning a bit pattern to a specific voltage range stored on the cell. This technology permits the storage of two or more bits per cell, depending on the quantity of voltage ranges assigned to the cell.

For example, a memory cell may be assigned four different voltage ranges of 400 mV for each range. Typically, a dead space or margin of 0.2 V to 0.4 V is between each range. If the voltage stored on the cell is within the first range, the memory cell is storing, for example, a "01." If the voltage is within the second range, the memory cell is storing, for example, a "00." This continues for as many ranges as are used to define logic states for the memory cell.

The multi-level cell (MLC) embodiments of the present invention are not limited to two bits per cell. Some embodiments may store more than two bits per cell, depending on the quantity of different voltage ranges that can be differentiated on the memory cell.

During a typical programming operation, the selected wordline for the flash memory cell to be programmed is biased with a programming pulse at a voltage that, in one embodiment, is about 19 V. A verification operation with a wordline voltage of 0.5 V is then performed to determine if a floating gate is at the proper voltage (e.g., 0.5 V). The unselected wordlines for the remaining cells are typically biased with at approximately 9 V during the program operation. In one embodiment, the unselected wordline voltages can be any voltage above ground potential. Each of the memory cells is programmed in a substantially similar fashion.

A typical memory block may be comprised of 64 "pages," or groups, of single level cells. An MLC memory block is typically comprised of 128 pages. When one of these pages is accessed, the remaining pages in the block can experience a disturb condition. This occurs for both a read and a write access. In both cases, the pages share common wordlines and bit lines that can experience higher programming/read voltages whenever any one of the pages is programmed/read. These voltages can cause problems by disturbing the stored threshold voltages ($V_t$) for the cells that are not being accessed.

Figure 2A:
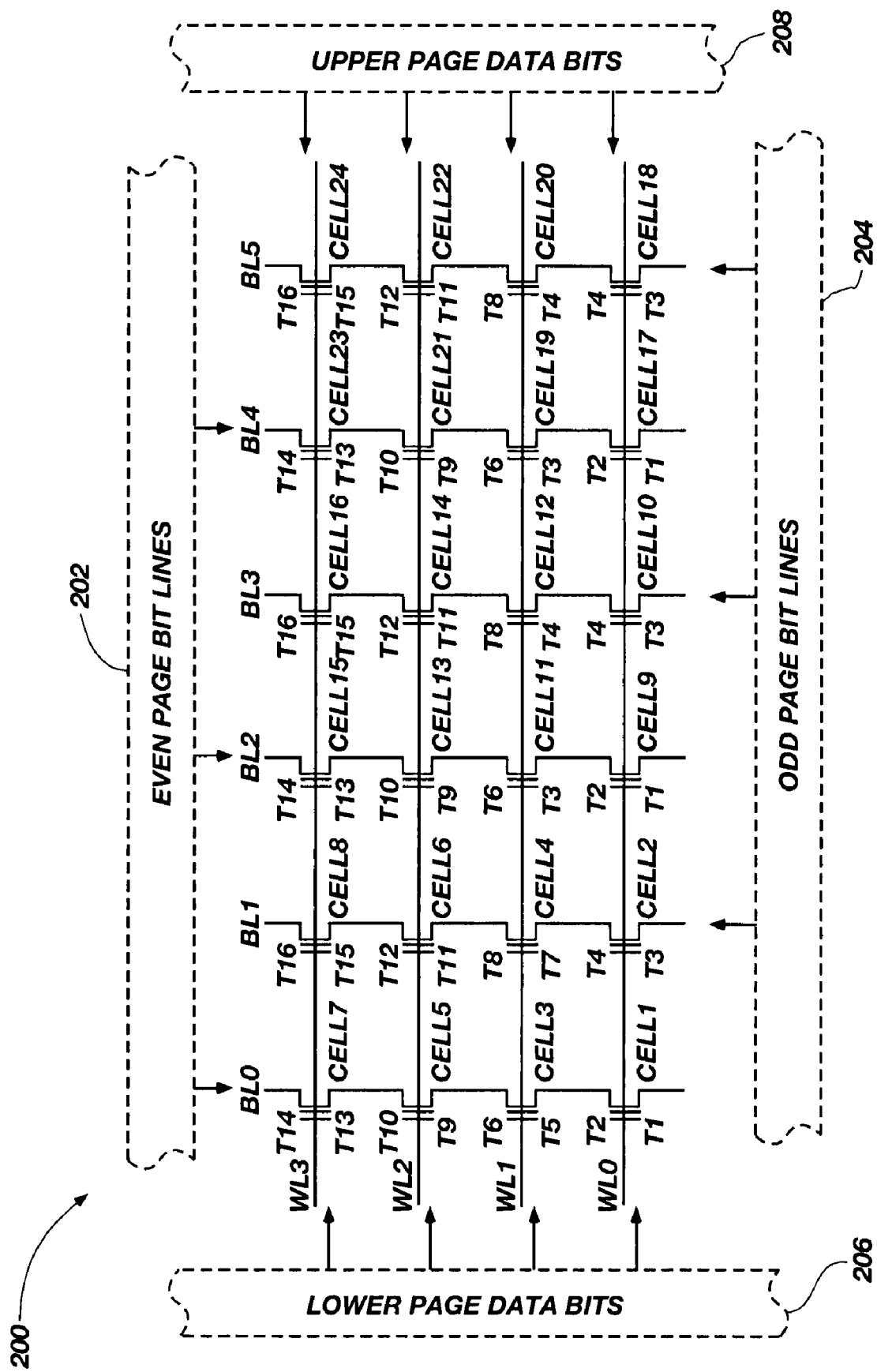
FIGS. 2A and 2B illustrate a portion of an array of flash memory cells partitioned into pages, in accordance with various embodiments of the present invention.
Figure 2B:
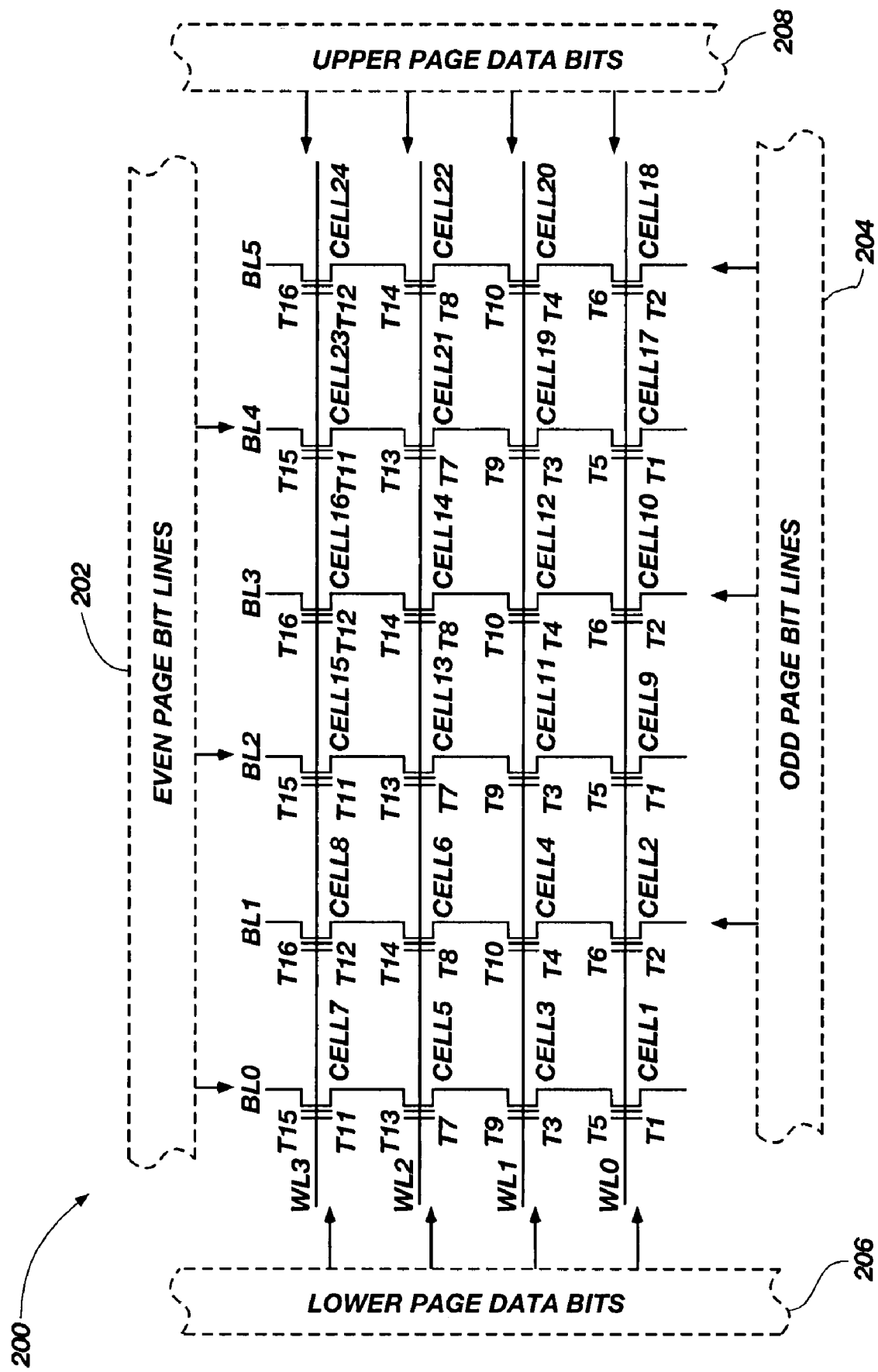

FIG. 2A and FIG. 2B illustrate a portion of an array 200 of flash memory cells partitioned into pages, in accordance with various embodiments of the present invention. In one embodiment of the present invention, memory cells are partitioned into even and odd pages according to alternating even and odd bit lines (BL0-BL5) forming even page bit lines 202 and odd page bit lines 204. While the present illustrated embodiment partitions pages into two separate pages, namely, an even page and an odd page, additional groupings of bit lines for forming additional paging schemes is also contemplated.

As stated above, the use of multi-level cell (MLC) programming techniques enables further formation of pages by storing more than two logic states in each flash memory cell. Specifically, FIG. 2A illustrates one lower page data bit 206 with two logic states forming a lower page of data in the memory cells along a portion of a wordline and another upper page data bit 208 with two logic states forming an upper page of data in the memory cells along the same portion of the same wordline. While the present illustration partitions the pages into two separate pages, namely, a lower page and an upper page, additional logic states may also generate additional paging schemes which are contemplated within the scope of the present invention.

FIG. 2A further illustrates an order in which memory cells and pages of the array may be programmed. For purposes of clarity, only eight cells (i.e., four wordlines with even and odd bit lines) are discussed while twenty four cells are illustrated to convey the various paging concepts. However, this method is repeated to include an entire block of memory wordlines. Each row of the diagram of FIG. 2A illustrates the write operation to each of cells 1-8 that are illustrated in FIG. 1. It is noted that write operations occur in a parallel manner with words or even entire pages being simultaneously programmed or written. Accordingly, the discussion regarding the programming of cells 1-8 concurrently occurs across the same wordline for the entire size of the word or page. For example, the description of the programming of cell 1 is equally applicable to the concurrent programming of other flash memory cells on wordline WL0 and even numbered bit lines (e.g., BL2, BL4, etc.).

In a first write operation at sequence time T1, one bit of data is written to the first even lower page including memory cell 1, cell 9, cell 17, etc. A second write operation at sequence time T2 writes one bit of data to the first even upper page including memory cell 1, cell 9, cell 17, etc. A third write operation at sequence time T3 writes one bit of data to the first odd lower page including memory cell 2, cell 10, cell 18, etc. A fourth write operation at sequence time T4 writes one bit of data to the first odd upper page including memory cell 2, cell 10, cell 18, etc. A fifth write operation at sequence time T5 writes one bit of data to the second even lower page including memory cell 3, cell 11, cell 19, etc. A sixth write operation at sequence time T6 writes one bit of data to the second even upper page including memory cell 3, cell 11, cell 19, etc. A seventh write operation at sequence time T7 writes one bit of data to the second odd lower page including memory cell 4, cell 12, cell 20, etc. An eighth write operation at sequence time T8 writes one bit of data to the second odd upper page including memory cell 4, cell 12, cell 20, etc.

Similarly, a ninth write operation at sequence time T9 writes one bit of data to the third even lower page including memory cell 5, cell 13, cell 21, etc. A tenth write operation at sequence time T10 writes one bit of data to the third even upper page of memory cell 5, cell 13, cell 21, etc. An eleventh write operation at sequence time T11 writes one bit of data to the third odd lower page of memory cell 6, cell 14, cell 22, etc. A twelfth write operation at sequence time T12 writes one bit of data to the third odd upper page of memory cell 6, cell 14, cell 22, etc. A thirteenth write operation at sequence time T13 writes one bit of data to the fourth even lower page of memory cell 7, cell 15, cell 23, etc. A fourteenth write operation at sequence time T14 writes one bit of data to the fourth even upper page of memory cell 7, cell 15 cell 23, etc. A fifteenth write operation at sequence time T15 writes one bit of data to the fourth odd lower page of memory cell 8, cell 16, cell 24, etc. A sixteenth write operation at sequence time T16 writes one bit of data to the fourth odd upper page of memory cell 8, cell 16, cell 24, etc.

Thus, the programming of sixteen pages of memory cells: four even bit line lower pages (one for each of four wordlines), four add bit line lower pages (one for each of four wordlines), four even bit line upper pages (one for each of four wordlines), and four add bit line upper pages (one for each of four wordlines), has been described. While partitioning of pages along even and odd bit lines and the storage of four unique logic states per cell, other partitionings and additional logic states for forming alternative or additional pages are also contemplated.

FIG. 2B illustrates an alternative order in which memory cells and pages of the array may be programmed. The present embodiment utilizes the writing characteristics of the embodiment of FIG. 2A, however, the sequencing pattern is altered. While the present illustration notes an alternated programming pattern of writing lower and upper pages, the present illustration is not to be interpreted as inclusive of alternating programming patterns. For example, a specific programming pattern for writing lower and upper pages may be determined based upon data size and device performance. Accordingly, alternate programming timing sequences may be further determined by those of ordinary skill in the art.

Figure 3A:
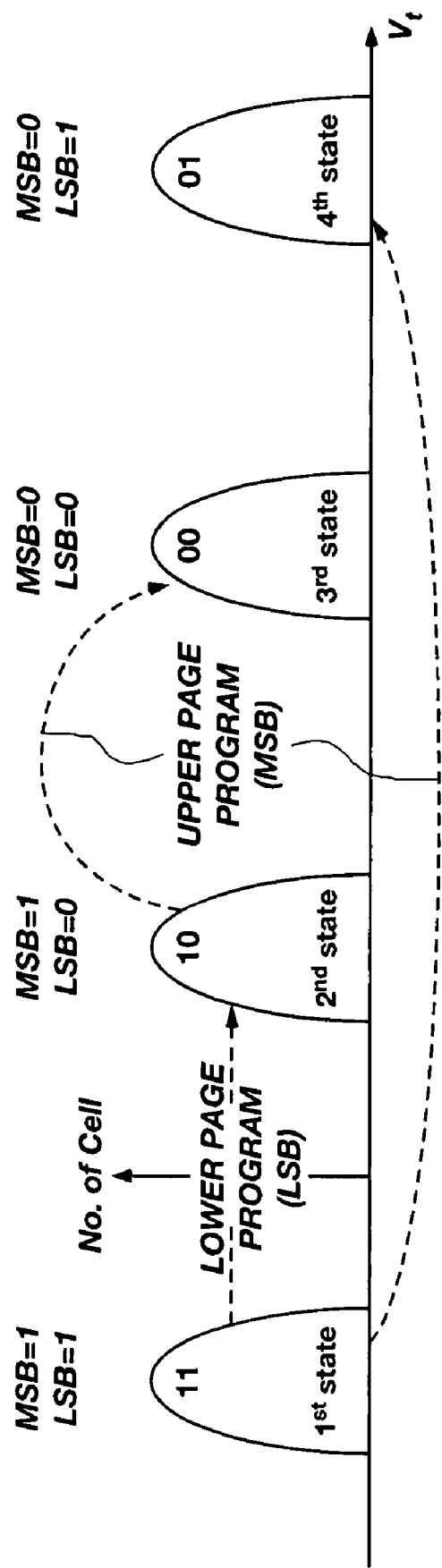
FIGS. 3A and 3B are diagrams of various logic states of a multiple level flash memory cell, in accordance with various embodiments of the present invention.
Figure 3B:
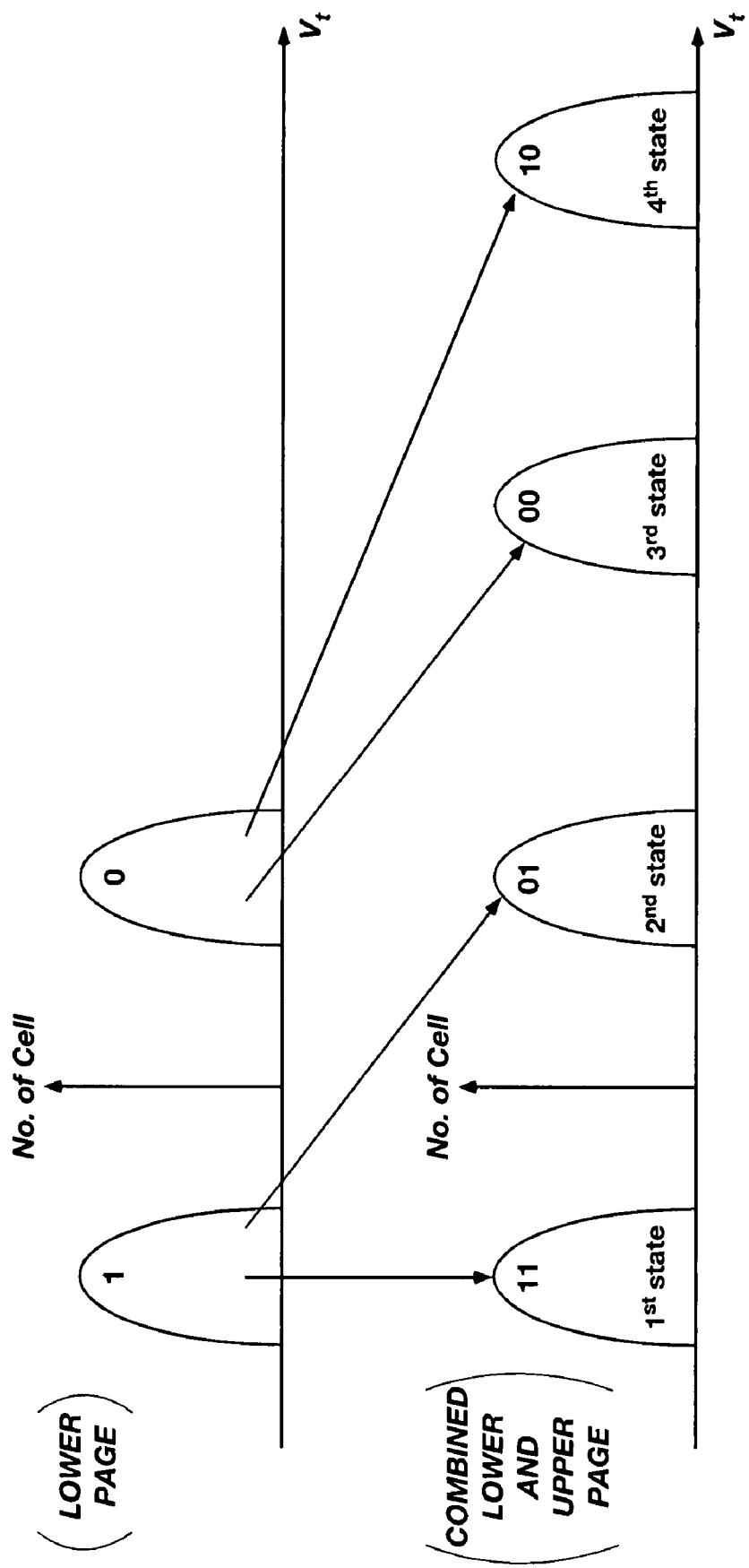

FIG. 3A and FIG. 3B are diagrams of various logic states of a multiple level flash memory cell, in accordance with various embodiments of the present invention. Each memory cell can be programmed as a multi-level cell (MLC) and each memory cell's threshold voltage ($V_t$) determines the data that is stored in the cell. For example, in a single bit of a single level cell (SLC) memory cell, a $V_t$ of 1 V might indicate a programmed cell while a $V_t$ of −1 V might indicate an erased cell.

In order to change (program) the cell transistor from its initial state to its programmed state, a process known as Fowler-Nordheim (FN) tunneling is utilized. Briefly, a relatively large positive potential difference is created between the control gate and the substrate, and excited electrons within the channel on the surface of the substrate are caused to be pushed through and trapped in the floating gate. These negatively charged electrons act as a barrier between the control gate and channel on the substrate, thus increasing the threshold voltage of the cell transistor as represented in FIG. 3A and FIG. 3B. The cell transistor can be brought back to its initial state by forming a large negative potential difference between the control gate and the substrate, whereby resultant FN tunneling draws the trapped electrons back across the thin oxide layer between the floating gate and substrate, thus removing the electron barrier and decreasing the threshold voltage $V_t$.

The multi-level cells (MLCs) have more then two $V_t$ windows that each indicates a different state, as illustrated in FIG. 3A and FIG. 3B. The threshold voltage of a flash memory cell defines its stored logic value. Multi-level cells (MLCs) take advantage of the nature of a traditional flash cell by assigning a bit pattern to a specific voltage range stored on the memory cell. This technology permits the storage of two or more bits per cell, depending on the quantity of voltage ranges assigned to the cell.

For example, a cell may be assigned four different voltage $V_t$ distributions. The width of the distribution may be 400 mV. Typically, a separation of 0.3 V to 0.5 V is assigned between each $V_t$ distribution range. This separation zone between the $V_t$ distributions is to insure that the multiple $V_t$ distributions do not overlap causing logic errors. During verification, if the voltage stored on the cell is sensed to be within the assigned high $V_t$ distribution, then the cell is storing, for example, a "01" state. If the voltage is within the assigned second highest distribution, the cell is storing, for example, a "00" state. This continues for as many ranges as are utilized for defining the states of the cell.

As stated, multi-bit (or multi-state) non-volatile memories are characterized by utilizing each cell transistor to store two or more bits of data simultaneously. The threshold voltages $V_t$ of the large numbers of flash cell transistors found in flash memory devices generally exhibit bell curve distributions as illustrated in FIG. 3A and FIG. 3B. In the example of FIG. 3A and FIG. 3B, a programmed cell can be programmed to any one of four different threshold distributions, i.e., a first state, a second state, a third state or a fourth state. Any memory cell having a threshold voltage within the distribution defined by one of these four states is assigned a corresponding two-bit logic value, for example, "11", "10", "00" and "01" as shown in FIG. 3A. The particular bit assignments illustrated in FIG. 3 are known in the art as "gray-coding."

As mentioned above, a memory cell is said to be "programmed" when its threshold voltage is increased from its normally ON state (its erased state) to a threshold voltage of a higher state. In FIG. 3A and FIG. 3B, the threshold voltage distribution of "11" may be assigned as the erased state. In two-bit programming of the memory cell, two successive programming operations are executed, namely, a lower page (LP) program sequence, and an upper (UP) program sequence. In accordance with one embodiment of the present invention, the LP program sequence corresponds with the programming of a lower page of the memory array and the UP program sequence corresponds with the programming of an upper page of the memory array, as illustrated with reference to FIG. 2A and FIG. 2B.

As illustrated in FIG. 3A and FIG. 3B, the memory cell is initially in an erased state, and accordingly, its initial logic value is "11". In this example, if the least significant bit (LSB) of the data to be stored is "0", then a programming operation is executed to increase the threshold voltage of the memory cell from the first state to the second state. On the other hand, if the LSB of the data to be stored is "1", no programming is executed during the LSB program mode. Note here that the memory cell is either in the first state or the second state after the lower page or LSB programming sequence.

Also as illustrated with respect to FIG. 3A, a subsequent programming of the memory cells is performed to combine data from an upper page of the memory array with the already stored data in the lower page of the memory array. Programming of the upper page or the MSB programming sequence is illustrated according to the above-described "gray-coding." Regardless of whether the memory cell transistor is in the first state or the second state after the lower page or LSB programming sequence, no programming is executed in the upper page or MSB programming sequence if the logic value of the data to be stored is a logic "1" since such a data value is already resident from the previous erasure of the memory cell.

Alternatively, if the upper page or most significant bit (MSB) of the data to be stored is "0", then programming occurs which is dependent on whether the memory cell is in the first state or the second state following the previously performed lower page or LSB programming sequence. This is shown by the state transition lines indicated as dashed lines appearing in FIG. 3A. Specifically, if the upper page data or MSB of the data to be stored is "0", and if the memory cell is in the first state after the lower page or LSB programming sequence, then programming is executed to bring the threshold voltage of the memory cell from the first state to the fourth state. On the other hand, if the upper page or MSB of the data to be stored is "0", and if the memory cell is in the second state after the lower page or LSB programming sequence, then programming is executed to bring the threshold voltage of the memory cell from the second state to the third state. FIG. 3B illustrates an alternate state transition configuration.

The embodiments of the present invention are not limited to two bits (most significant bit MSB and least significant bit LSB) per cell. Some embodiments may store more than two bits per cell, depending on the quantity of different voltage ranges that can be differentiated from the memory cell.

During a typical programming operation, the selected wordline for the flash memory cell to be programmed is applied with a train of high voltage programming pulses. These high voltage programming pulses typically start at 16 V to 18 V and increment in 0.5 V increments. Also, for example, a 9 V incrementing or non-incrementing voltage pulse is applied on the unselected wordlines. As illustrated above with reference to FIG. 2A and FIG. 2B, the selected wordline is coupled to memory cells of pages of memory cells being currently programmed as well as memory cells of pages that are not presently being programmed.

To inhibit deselected pages of memory cells from programming on the selected wordline, the channel of the string of flash memory cells of the deselected pages of memory cells are decoupled from their respective bit lines $BL_X$ by applying ~2.5 V on the respective bit line. The channel area of these memory cells will rise with the wordline pulse based on the coupling of the memory cell resulting in a differential voltage between the selected wordline and the channel insufficient to program the memory cell of the unselected memory page.

To program selected cells on the selected wordline, the channel is grounded to 0 V through the respective bit lines $BL_X$. The large potential formed between the channel and the wordline causes the memory cell to program and the $V_t$ of the device will increase as higher programming pulses are applied.

A verification phase is performed between every programming pulse. During verification, for example, the selected wordline is lowered to 0 V, the unselected wordlines are lowered to 5 V, and the states of the selected cells are sensed. If the cell is programmed to have a $V_t$ level such that the 0 V on the wordline cannot make the memory cell conduct, the device is considered to be programmed. Otherwise the cell is considered to be still erased and the programming pulse height is increased by 0.5 V and applied to the selected wordline again. This process is repeated until all selected cells that need to be programmed are all programmed or the memory cell is determined to be defective.

A memory array comprised of many logical pages, an example of which may be 64 logical pages, may be formed with 32 physical wordlines. Each wordline contains two logical pages, an even logical page and an odd logical page, as illustrated with respect to FIG. 2. By way of example, 4K byte memory cells could be formed on a wordline with 2K byte memory cells being dedicated for the even page and another 2K byte memory cell page being dedicated to the odd page. If every memory cell is used in a multi-level cell (MLC) configuration, then a wordline would hold four pages of 2K byte bits per page, namely an even lower page, an odd lower page, an even upper page and an odd upper page.

When one of these pages is being programmed, another page on the same wordline is subject to experience disturb conditions even though it may be inhibited. Therefore, pages with shared wordlines can experience program disturb conditions. The programming disturb caused in unselected pages of memory cells on the shared wordline shifts the $V_t$ distribution of memory cells that were previously programmed in an earlier page of a multi-level memory cell resulting in a spreading of the threshold voltage distributors of FIG. 3A and FIG. 3B. For non-volatile memory devices that use two logic levels per cell, the shift may not be a major problem since the separation zone between the two distributions is large enough to prevent the distributions from overlapping due to programming disturb conditions. However, for multi-level cell (MLC) operation where a single cell is used to represent two bits of at least four logic states per physical single memory cell, the separation zone is reduced. Attention to reducing programming disturb becomes extremely important in order to prevent $V_t$ distributions from overlapping or shifting causing misinterpretation of stored data when the various logic states are read from the memory cell based on an interpretation of the expected $V_t$ distribution.

Figure 4:
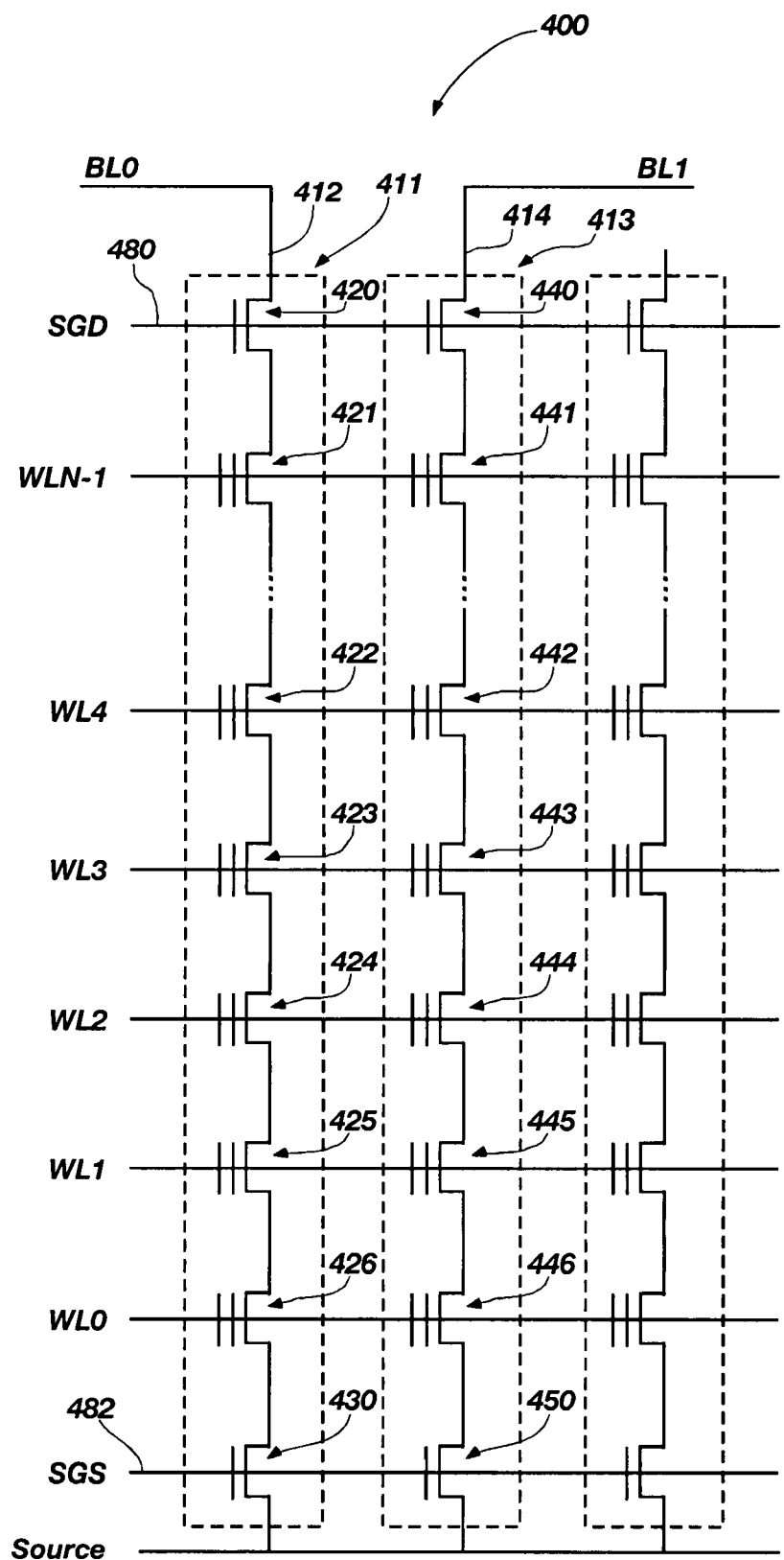
FIG. 4 illustrates a portion of a flash memory cell array configured for programming, in accordance with various embodiments of the present invention.

FIG. 4 illustrates a portion of a flash memory cell array 400 configured for programming, in accordance with various embodiments of the present invention. As illustrated in FIG. 4, memory cell array 400 includes memory cells 421-426 and 441-446. As stated, when programming a flash memory cell, a program voltage is applied to the control gate and the channel area of the flash memory cell string. The channel area of the selected memory cell that is selected for programming is at an initial reference such as ground (0 V). During programming, electrons from the channel area under the flash memory cell string are injected into the floating gate of the selected memory cell. When electrons accumulate in the floating gate, the floating gate becomes negatively charged and the threshold voltage of the cell is raised as was illustrated above with reference to FIG. 3. To ground the channel area of the selected flash memory cell string, the corresponding bit line 412 is grounded (0 volt), while the SGD transistor 420 is connected at the gate to a sufficiently high voltage (typically $V_{cc}$ at for example 3.3 volts) that is higher than the threshold voltage of the selected memory cell.

To apply the program voltage to the control gate of the memory cell being programmed, the program voltage is applied to the appropriate wordline. As discussed above, that wordline, for example wordline WL2, is also connected to one memory cell in each of the other flash memory cell strings that utilize the same wordline. For example, when programming memory cell 422 of FIG. 4, the program voltage is also applied to the control gate of memory cell 442 because both cells share the same wordline.

As stated above, a problem arises when it is desired to program one memory cell on a wordline without programming other memory cells connected to the same wordline, for example, when it is desired to program memory cell 422 on a selected flash memory cell string 411 and not memory cell 442 on deselected flash memory cell string 413. Because the program voltage is applied to all memory cells connected to a wordline, an unselected cell (a cell that is not to be programmed) on the wordline may become inadvertently programmed. For example, memory cell 442 of selected flash memory cell string 411 is adjacent to memory cell 422 of deselected NAND string 413. When programming the selected memory cell 422, there is a concern that the unselected memory cell 442 might unintentionally be programmed causing a "program disturb" condition. More generally speaking, "program disturb" is used to describe any unwanted threshold voltage shift, either in the positive or negative direction, which can occur during a programming operation and is not necessarily limited to memory cells on the selected wordline.

Several techniques have been devised to mitigate programming disturb conditions of unselected memory cells. Such techniques have come to be known as "boosting" techniques applied to the unselected flash memory cell strings that share a common wordline with a memory cell of a flash memory cell string that is selected for programming. Some boosting techniques include "self boost (SB)", "drain side self boost (DSSB)", and "modified drain side self boost (MDSSB)".

Figure 5:
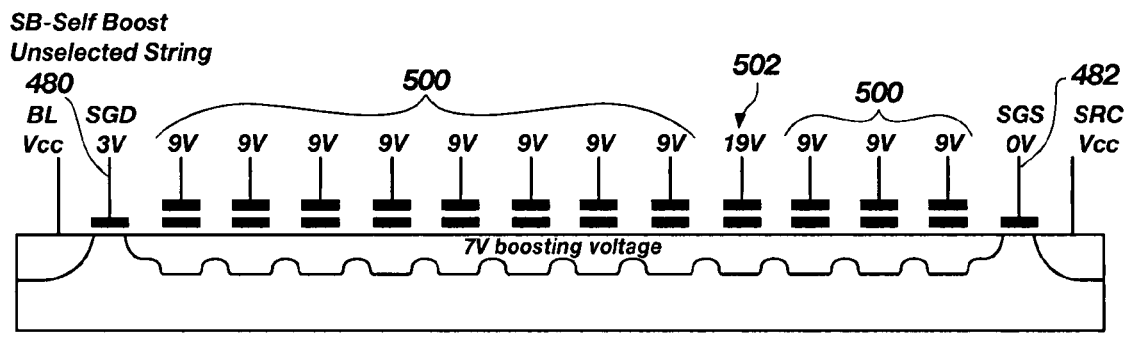
FIG. 5 illustrates a self boost arrangement of a string of memory cells according to an embodiment of the present invention.

FIG. 5 illustrates a self boost arrangement of a string of memory cells. Specifically, during programming using a self boost scheme, the channel areas of the unselected flash memory cell strings are electrically isolated from their corresponding bit lines and an intermediate pass voltage (e.g., 9 volts) is applied to the unselected wordlines 500 while a high program voltage (e.g., 19 volts) is applied to the selected wordline 502. The channel areas of the unselected NAND strings are capacitively coupled to the unselected wordlines 500, causing a voltage (e.g., 7 volts) to exist in the channel areas of the unselected NAND strings. The "self boosting" approach to mitigation of programming disturb conditions in unselected memory cells reduces the potential difference between the channel areas of the unselected flash memory cell strings and the program voltage that is applied to the selected wordline. As a result, for the memory cells in the unselected flash memory cell strings and especially for the memory cells in such strings on the selected wordline, the voltage across the tunnel oxide and hence the program disturb are significantly reduced.

By way of example and not limitation, when a self boost programming disturb mitigation technique is applied to the memory array 400 in FIG. 4 to program one of the cells on bit line 412, for example, zero volts is applied to the bit line 412 of the selected string 411 and voltage $V_{cc}$ (e.g., ~3 volts) is applied to a bit line 414 of the unselected string 413. The voltage $V_{cc}$ is applied to a drain select line SGD 480 to turn on the transistors 420 and 440 and zero volts is applied to a source select line SGS 482 to turn off transistors 430 and 450. Assuming that all of the memory cells 441-446 are in the normally on states (e.g., erased or negative threshold voltage state), the channel potential of all the cells in the string between transistors 440 and 450 is given by the difference between $V_{cc}$ applied to drain select line SGD 480 and the threshold voltage of the select transistor 440. For example, if $V_{cc}$ is 3 volts and the threshold voltage of transistor 440 is 1 volt, then the channel potential of all the cells 441-446 is charged to 2 volts.

Following the above operation, the channel is said to be "precharged" to a predefined potential, for example, of about 2 V. Since transistor 450 is turned off and transistor 440 will turn off automatically after the channel potential of the string has reached a sufficiently high value (e.g., 2 volts) the channel potential of memory cells 441-446 begins to float. As the programming process continues, the high programming voltage Vpgm (e.g., 19 volts) is applied to the wordline WL3, and an intermediate voltage Vpass (e.g., 9 volts) is applied to the remaining wordlines. As illustrated in FIGS. 4 and 5, the channel potential of memory cells 441-446 is bootstrapped or boosted from 2 volts, the initial precharged level, to a value such as 7 volts due to capacitive coupling. Therefore, even though a high voltage such as 19 volts is applied to the control gate of memory cell 443, the potential difference between such high voltage and the channel potential is not adequate to cause electron tunneling through the oxide to the floating gate of memory cell 443, thereby preventing program disturb.

A flash memory cell string is conventionally programmed from the source side to the drain side, for example, from memory cell 426 to memory cell 421. When the programming process is ready to program the last (or near the last) memory cell of the string, if all or most of the previously programmed cells on the unselected string (e.g., string 413) were programmed, then there is negative charge in the floating gates of the previously programmed cells. Because of this negative charge on the floating gates, the precharging can not take place completely, resulting in a lower initial potential of the channel area under the string and the subsequent self-boosting of such channel area becomes less effective. Therefore, the boosted potential in the channels of the unselected strings may not become high enough to mitigate unintended programming and therefore the memory cells still may be susceptible to program disturb on the last few wordlines of the string. For example, when the programming voltage is applied to WLN-1, if memory cells 446, 445, 444, and 443 on the unselected string, then each of those memory cells 443, 444, 445, 446 has a negative charge on its floating gate which will limit the boosting level of the self boosting process and possibly cause program disturb on memory cell 441.

Figure 6:
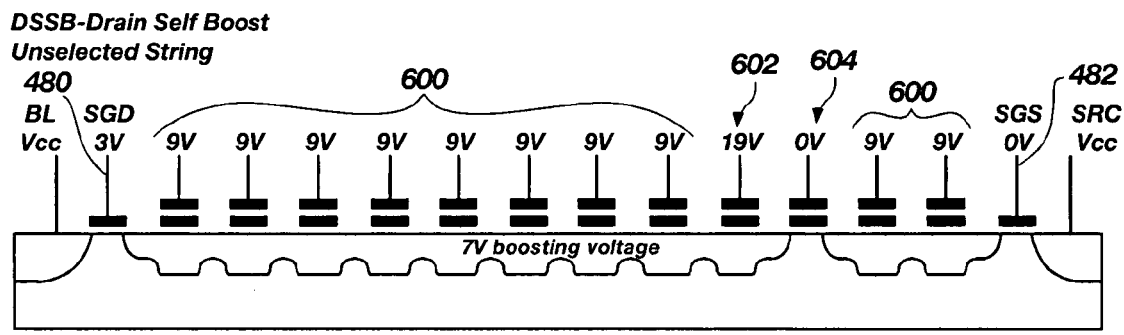
FIG. 6 illustrates an additional program disturb mitigation technique applied to a string of memory cells known as "drain side self boost (DSSB)" according to an embodiment of the present invention.

FIG. 6 illustrates an additional program disturb mitigation technique applied to a string of memory cells known as "drain side self boost (DSSB)". For the drain side self boosting technique, the precharging and other steps as described above are applicable. Specifically during programming using the drain side self boost (DSSB) scheme, the channel areas of the unselected strings are electrically isolated from their corresponding bit lines and an intermediate pass voltage (e.g., 9 volts) is applied to unselected wordlines 600 while a high program voltage (e.g., 19 volts) is applied to a selected wordline 602. A voltage of zero volts is applied to an unselected wordline 604 located immediately adjacent on the source side of the selected wordline 602 so that the memory cell 443 of FIG. 4 is turned off (e.g., an "off-cell").

Thereafter the channel areas of the unselected strings are capacitively coupled to the unselected wordlines 600, causing a voltage (e.g., 7 volts) to exist in the channel areas on the drain side of the unselected strings. Therefore, the channel potential of the channel region of memory cell 443 may be self boosted by the high programming voltage Vpgm to a voltage level that is higher than that achieved when the channel region of memory cell 443 is influenced by the self boosting in the remaining memory cells 444, 445, and 446. This prevents program disturb when memory cell 423 is being programmed. Therefore, by applying zero volts to wordline WL2, the length of the channel for programming has been shorted and therefore any accumulating negative voltages on the floating gates in the string of memory cells that have already been programmed are isolated.

Figure 7:
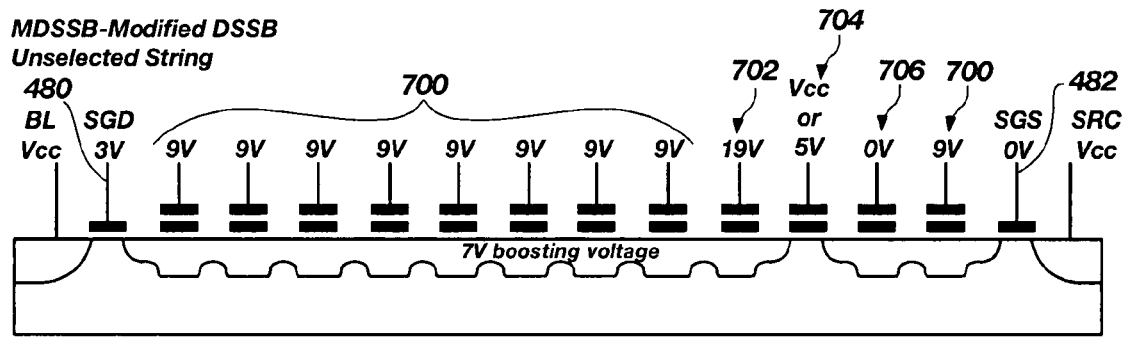
FIG. 7 illustrates yet another program disturb mitigation technique applied to a flash memory cell string of memory cells known as "modified drain side self boost (MDSSB)" according to an embodiment of the present invention.

FIG. 7 illustrates yet another program disturb mitigation technique applied to a flash memory string of memory cells known as "modified drain side self boost (MDSSB)". For the modified drain side self boosting (MDSSB) technique, the precharging and other steps as described above are applicable. Specifically, during programming using the modified drain side self boost scheme, the channel areas of the unselected strings are electrically isolated from their corresponding bit lines and an intermediate pass voltage (e.g., 9 volts) is applied to unselected wordlines 700 while a high program voltage (e.g., 19 volts) is applied to a selected wordline 702. An intermediate voltage (e.g., $V_{cc}$ or 5 volts) is applied to an unselected wordline 704 located immediately adjacent on the source side of the selected wordline 700 so that the memory cell 444 of FIG. 4 is turned slightly on. A voltage of zero volts is applied to an unselected wordline 706 located immediately adjacent on the source side of the unselected wordline 704 so that the memory cell 445 is turned off (e.g., an "off-cell").

Thereafter, the channel areas of the unselected strings are capacitively coupled to the unselected wordlines 700, causing a voltage (e.g., 7 volts) to exist in the channel areas on the drain side of the unselected strings. Therefore, the channel potential of the channel region of memory cell 443 may be self boosted by the high programming voltage Vpgm to a voltage level that is higher than that achieved when the channel region of memory cell 443 is influenced by the self boosting in the remaining memory cells 444, 445, and 446. This prevents program disturb when memory cell 423 is being programmed. Therefore, by applying an intermediate voltage to wordline WL2 and zero volts to wordline WL1, the length of the channel for programming has been shorted and any accumulating negative voltages on the floating gates in the string of memory cells that have already been programmed are isolated.

Figure 8:
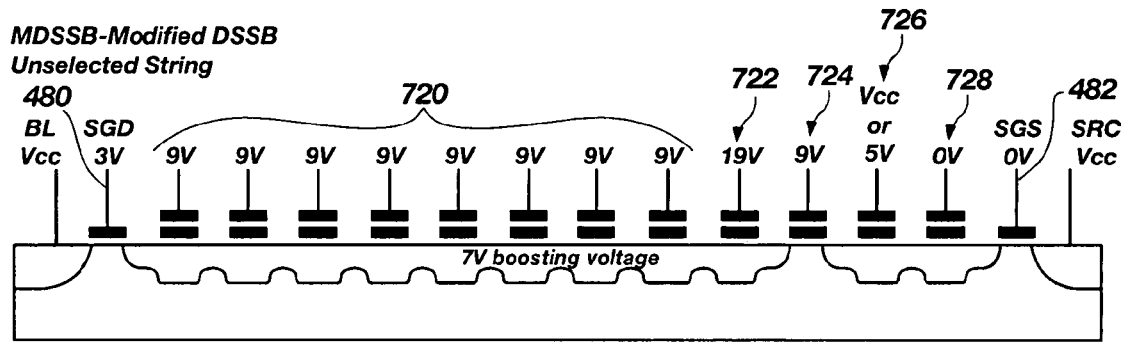
FIG. 8 illustrates yet another program disturb mitigation technique applied to a flash memory cell string of memory cells known as "advanced modified drain side self boost (AMDSSB)" according to an embodiment of the present invention.

FIG. 8 illustrates yet another program disturb mitigation technique applied to a flash memory string of memory cells known as an "advanced modified drain side self boost (AMDSSB)". For the advanced modified drain side self boosting (AMDSSB) technique, the precharging and other steps as described above are applicable. Specifically, during programming using the modified drain side self boost scheme, the channel areas of the unselected strings are electrically isolated from their corresponding bit lines and an intermediate pass voltage (e.g., 9 volts) is applied to unselected wordlines 720 while a high program voltage (e.g., 19 volts) is applied to selected wordline 722. A lower voltage (e.g., 9 volts) is applied to an unselected wordline 724 located immediately adjacent on the source side of the selected wordline 722. A further intermediate voltage (e.g., $V_{cc}$ or 5 volts) is applied to the next adjacent unselected wordline 726 so that the memory cell is turned slightly on. A voltage of zero volts is applied to an unselected wordline 728 located next adjacent on the source side of the unselected wordlines 724, 726 so that the memory cell is turned off (e.g., an "off-cell").

While various boosting techniques have been described, the various boost techniques have benefits and disadvantages. As described above with reference to FIGS. 2 and 3, flash memory arrays may be partitioned into various pages according to, for example, an even and odd page configuration and a lower and upper page configuration when multi-level cell (MLC) techniques are utilized. Because of the extended range of voltages utilized in multi—level cell (MLC) memory cells, utilization of a common boosting technique for both lower and upper pages is not advantageous.

Specifically, program disturbs may occur due to leakage current in an "off-cell," for example, when a modified drain side self boost (MDSSB) or advanced modified drain side self boost (AMDSSB) technique is applied to ideally cut-off the boosting voltage from the source side in the unselected strings. However, if a program disturb occurs using, for example, a modified drain side self boost (MDSSB) or an advanced modified drain side self boost (AMDSSB) boosting scheme for programming the lower page, the program disturb failure is exaggerated during programming of the upper page due to misrecognition of the disturbed lower page data. Accordingly, the various embodiments of the present invention utilize different boosting techniques for the programming of lower and upper pages in a flash memory array utilizing multi-level cell (MLC) techniques.

Figure 9:
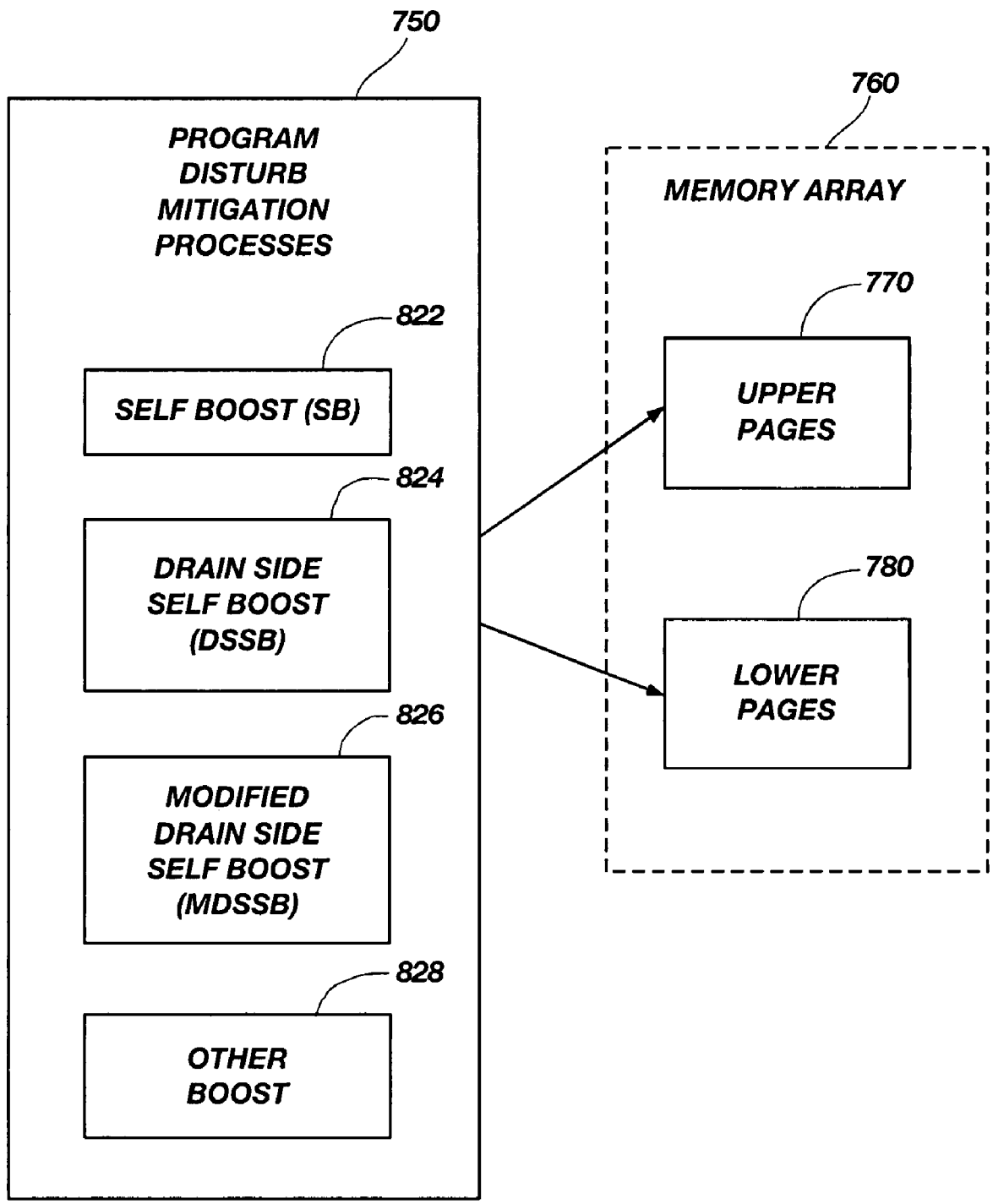
FIG. 9 illustrates various program disturb mitigation boosting processes for boosting different pages of memory in a memory array, in accordance with the various embodiments of the present invention.

FIG. 9 illustrates various program disturb mitigation boosting processes 750 that may be variously utilized for boosting different pages of memory in a memory array 760, in accordance with the various embodiments of the present invention. In one embodiment of the present invention, a self boost (SB) process 822 program disturb mitigation technique is applied to the programming of lower pages 780 of memory cells in a multi-level cell (MLC) configured flash memory array 760. Upper pages 770 of memory cells in array 760 are differently boosted using one of the remaining boosting techniques such as a modified drain side self boost (MDSSB) process 826 program disturb mitigation technique. Alternatively, drain side self boost process (DSSB) 824 program disturb mitigation techniques or other boost process 828 mitigation techniques may also be utilized. It should be noted that various boosting techniques are process dependent and employed based upon memory cell leakage conditions or other dependencies which may be empirically determined and resolved using varying boosting techniques.

Figure 10:
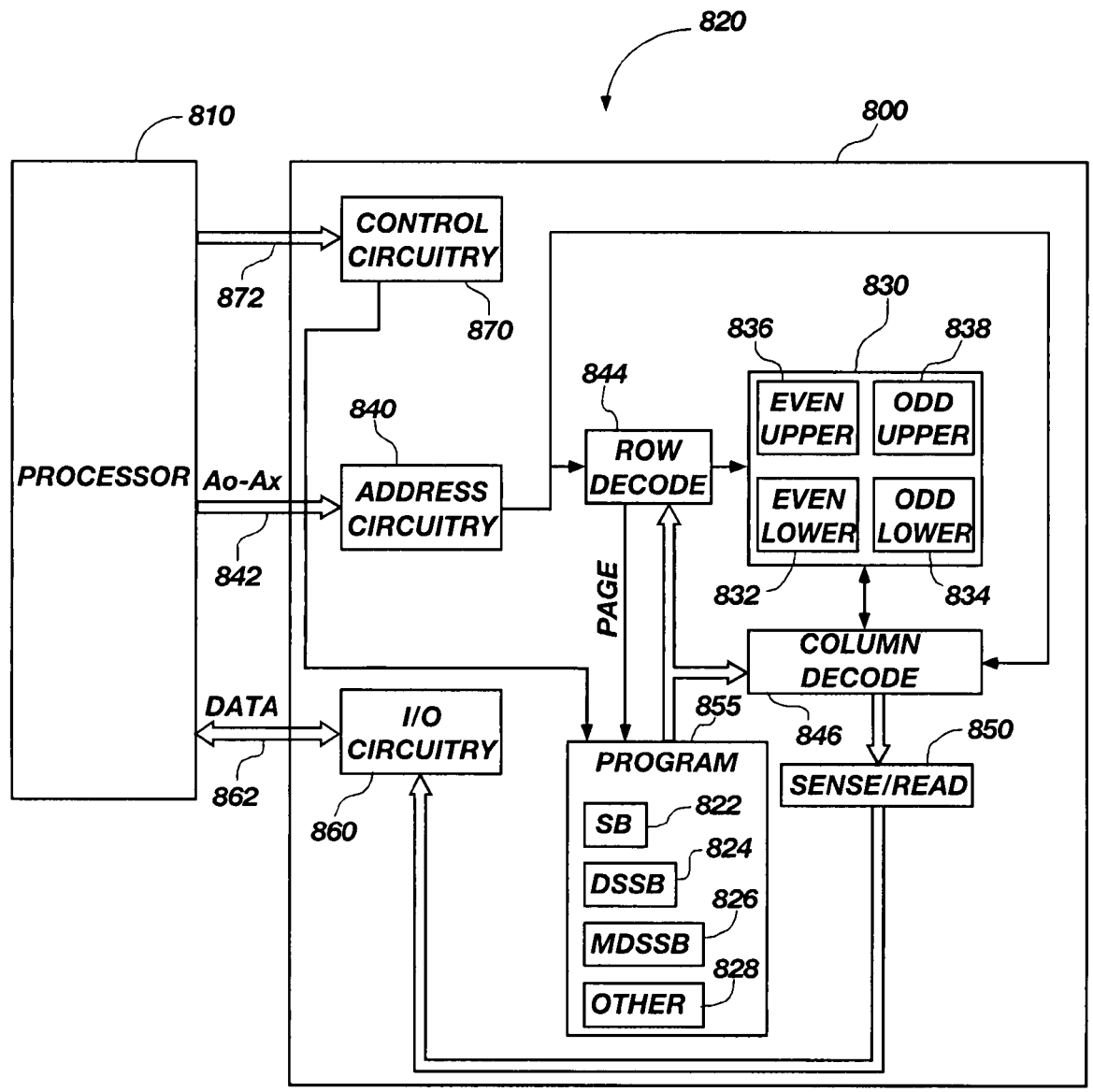
FIG. 10 illustrates a functional block diagram of an electronic system including a memory device, in accordance with an embodiment of the present invention.

FIG. 10 illustrates a functional block diagram of an electronic system including a memory device, in accordance with an embodiment of the present invention. A memory device 800 incorporates the flash memory array and programming method embodiments of the present invention. The memory device 800 is coupled to a processor 810. The processor 810 may be a microprocessor or some other type of controlling circuitry. The memory device 800 and the processor 810 form part of an electronic system 820. The memory device 800 has been simplified to focus on features of the memory that are helpful in understanding the present invention. Electronic system 820 may be configured as a personal computer, a digital camera, a PDA, a cellular telephone, an MP3 player, a control system, or any other system employing memory.

The memory device 800 includes a memory array 830 of flash memory cells as described above with reference to FIGS. 1-9. The memory array 830 is arranged in banks of rows and columns. The control gates of each row of memory cells is coupled with a wordline while the drain and source connections of the memory cells are coupled to bit lines. An address buffer circuit 840 is provided to latch address signals provided on address input connections A0-Ax 842. Address signals are received and decoded by a row decoder 844 and a column decoder 846 to access the memory array 830 including various pages such as lower pages 832, 834 and upper pages 836, 838. It will be appreciated by those skilled in the art, with the benefit of the present description, that the number of address input connections depends on the density and architecture of the memory array 830. That is, the number of addresses increases with both increased memory cell counts and increased page counts.

The memory device 800 reads data in the memory array 830 by sensing voltage or current changes in the memory array columns using sense/read circuitry 850. The sense/read circuitry, in one embodiment, is coupled to read and latch a row of data from the memory array 830. Data input and output buffer circuitry 860 is included for bi-directional data communication over a plurality of data connections 862 with the processor 810. Program circuitry 855 is provided to write data to the memory array 830. Program circuitry 855 directs boosting process (e.g., self boost (SB) process 822, drain side self boost (DSSB) process 824, modified drain side self boost (MDSSB) process 826 and other advanced boost processes 828 (e.g., advanced modified drain side self boost (AMDSSB)) of unselected flash memory cell strings in the memory array 830 in response to defined page types (e.g., lower page and upper page) of memory cells to be programmed.

Control circuitry 870 decodes signals provided on control connections 872 from the processor 810. These signals are used to control the operations on the memory array 830, including data read, data write (program), and erase operations. The control circuitry 870 may be a state machine, a sequencer, or some other type of controller. In one embodiment, the control circuitry 870 and program circuitry 855 execute the embodiments of the programming methods of the various embodiments of the present invention. The flash memory device illustrated in FIG. 9 has been simplified to facilitate a basic understanding of the features of the memory. A more detailed understanding of internal circuitry and functions of flash memories are known to those skilled in the art.

The processes and devices described above illustrate exemplary methods and devices out of many that may be used and produced according to the embodiments of the present invention. The above description and drawings illustrate embodiments which provide significant features and advantages of the present invention. It is not intended, however, that the present invention be strictly limited to the above-described and illustrated embodiments.

Although the present invention has been shown and described with reference to particular embodiments, various additions, deletions and modifications that will be apparent to a person of ordinary skill in the art to which the invention pertains, even if not shown or specifically described herein, are deemed to lie within the scope of the invention as encompassed by the following claims.

What is claimed is:

1. A method for programming a multi-level cell memory array, comprising:
    boosting channels of unselected memory cells using at least a first boosting process when programming at least a first portion of logic states in a lower memory page in a multi-level cell memory cell; and
    boosting channels of unselected memory cells using at least a second boosting process when programming at least a second portion of logic states in an upper memory page in a multi-level cell memory cell, wherein using at least a second boosting process includes ensuring that the at least a second boosting process is different from the at least a first boosting process.

2. The method of claim 1, further comprising defining at least one of the logic states of the at least a second portion of logic states to have a higher threshold voltage than any of the at least a first portion of logic states.

3. The method of claim 1, wherein the at least a first boosting process is a self boosting process.

4. The method of claim 1, wherein the at least a second boosting process is a drain side self boosting process.

5. The method of claim 1, wherein the at least a second boosting process is one of a modified drain side self boosting process or an advanced modified drain side self boosting process.

6. A memory device, including:
    a memory array of multi-level cell memory cells configured to store at least a first portion of logic states and at least a second portion of logic states;
    at least a first boosting process configuration for applying to unselected memory cells when programming the at least a first portion of logic states into a lower memory page of at least one of the memory cells; and
    at least a second boosting process configuration for applying to unselected memory cells when programming the at least a second portion of logic states into an upper memory page of at least one of the memory cells, wherein the at least a second boosting process configuration is ensured to be different from the at least a first boosting process configuration.

7. The memory device of claim 6, wherein the at least a second portion of logic states includes at least one state defined by a threshold voltage greater than a highest threshold voltage of any of the at least a first portion of logic states.

8. The memory device of claim 7, wherein the at least a first boosting process configuration is a self boosting process configuration.

9. The memory device of claim 7, wherein the at least a second boosting process configuration is one of a drain side self boosting process configuration, a modified drain side self boosting process configuration or an advanced modified drain side self boosting process configuration.

10. A memory device, comprising:
    a memory array of multi-level cell flash memory cells arranged with a plurality of wordlines and bit lines; and
    programming circuitry configured to boost a channel of unselected flash memory cells sharing a common wordline using at least a first boosting process when at least a first portion of logic states of a lower memory page are being programmed on the common wordline and further configured to boost the channel of unselected flash memory cells using at least a second boosting process when at least a second portion of logic states of an upper memory page are being programmed on the common wordline, wherein the at least a second boosting process and the at least a first boosting process are ensured to be different.

11. The memory device of claim 10, wherein at least one of the at least a second portion of logic states is defined by a threshold voltage greater than a highest threshold voltage of any of the at least a first portion of logic states.

12. The memory device of claim 11, wherein the at least a first boosting process is a self boosting process.

13. The memory device of claim 11, wherein the at least a second boosting process is one of a drain side self boosting process, a modified drain side self boosting process or an advanced modified drain side self boosting process.

14. The memory device of claim 11, wherein the bit lines are alternatingly even and odd bit lines forming even and odd memory pages.

15. The memory device of claim 11, wherein the at least first and second portion of logic states are defined according to gray-coding.

16. An electronic system, comprising:
a processor for generating memory signals; and
a memory device coupled and configured to be responsive to the processor, the memory device comprising:
an array of multi-level cell memory cells; and
programming circuitry configured to boost unselected memory cells according to at least a first boosting process when at least first logic states are being programmed into a lower memory page of the memory cells and the programming circuitry further configured to boost unselected memory cells according to at least a second boosting process when at least second logic states are being programmed into an upper memory page of the memory cells, and the programming circuitry further configured to ensure that the at least a second boosting process is different from the at least a first boosting process.

17. The electronic system of claim 16, wherein at least a first portion of memory pages is defined by the at least first logic states and a second portion of memory pages is defined by the at least second logic states.

18. The electronic system of claim 16, wherein the at least a first boosting process is selected from one of self boosting, drain side self boosting, modified drain side self boosting, advanced modified drain side self boosting and the second boosting process is a different one.

* * * * *